United States Patent [19]

Sato et al.

[11] Patent Number: 5,708,625
[45] Date of Patent: Jan. 13, 1998

[54] VOLTAGE LEVEL DETECTOR

[75] Inventors: Hajime Sato; Takaaki Furuyama, both of Kasugai, Japan

[73] Assignee: Fujitsu Limited, Kawasaki, Japan

[21] Appl. No.: 415,512

[22] Filed: Apr. 3, 1995

[30] Foreign Application Priority Data

Apr. 12, 1994 [JP] Japan .................................. 6-073570

[51] Int. Cl.$^6$ ...................................................... G11C 7/00
[52] U.S. Cl. ........................ 365/233.5; 365/194; 327/77
[58] Field of Search ........................... 365/233.5, 194; 327/77, 78, 79, 80, 81, 51

[56] References Cited

U.S. PATENT DOCUMENTS

| 4,692,635 | 9/1987 | Rapp | 327/78 |
| 4,803,665 | 2/1989 | Kasa | 365/194 |
| 5,378,936 | 1/1995 | Kokubo et al. | 327/77 |

*Primary Examiner*—Son T. Dinh
*Attorney, Agent, or Firm*—Armstrong, Westerman, Hattori, McLeland & Naughton

[57] ABSTRACT

A voltage level detector insusceptible to noise is disclosed. The voltage level detector includes a detector section, an output circuit section coupled to the detector section, and a delay circuit section provided between the detector section and the output circuit section. The detector section receives a target signal, and determines if the voltage level of the target signal lies within a predetermined voltage zone. The output circuit section outputs a detection signal when the target signal is found to be in the predetermined zone by the detector section. When the detector section detects that the target signal has come off the predetermined voltage zone, the delay circuit section delays the vanishing of the detection signal output from the output circuit section by a given delay time.

12 Claims, 8 Drawing Sheets

VOLTAGE LEVEL DETECTOR

BACKGROUND OF THE INVENTION

1. Field of the Invention

The present invention relates generally to a voltage level detector, and in particular, to a voltage level detector for use in a semiconductor memory device.

2. Description of the Related Art

With the increasing use of semiconductor memory devices in mass produced consumer electronics, much attention has been given to decreasing memory device susceptibility to the effects of noise and other types of interference. Noise in particular degrades the performance of semiconductor memory devices. Consequently, it is important to provide a semiconductor memory device which exhibits stable operating characteristics despite the presence of a noise-superimposed signal.

FIG. 1 shows a block circuit diagram of an access system for the column address of a conventional dynamic random access memory (DRAM). The following describes the general operation of such a DRAM.

A column address buffer 51 receives an external address input signal $A_{IN}$ from an external input terminal (not shown), and outputs column address signals $CA_1$ to $CA_n$ to a column predecoder 52. The column predecoder 52 decodes the column address signals $CA_1$ to $CA_n$, and outputs a column predecode signal CPA to a column decoder 53. The column decoder 53 decodes the column predecode signal CPA, and outputs a column select signal CSL. A pair of bit lines BL and /BL are selected by the column select signal CSL. That is, the gate transistors Tg connected to a bit line pair BL and /BL turn on in response to the column select signal CSL. This allows a sense amplifier 54 to read data in a memory cell (not shown) selected by a word select signal. The read data is output to a current-mirror configured sense buffer circuit 55 via a pair of input/output buses IO and /IO connecting other bit line pairs. The sense buffer circuit 55 outputs this data as read data RD to an output buffer circuit 56. The buffer circuit 56, in turn, outputs data RD as output data $D_{OUT}$ to an external output terminal (not shown).

The column address signals $CA_1$ to $CA_n$ from the column address buffer 51 are also supplied to an address change detector 57. The address change detector 57 detects if at least one of the column address signals $CA_1$ to $CA_n$ has changed from high to low or from low to high. When any one of the column address signals $CA_1$ to $CA_n$ (for example, $CA_1$) rises to high as shown in FIG. 2, the address change detector 57 detects the signal change, and outputs an address change detection signal ATD that rises over a delay time, ta, and that falls low after a time period, tb. Time period, tb, is shorter than the interval between column address signal changes.

The address change detection signal ATD is supplied to the column predecoder 52 and to the sense buffer circuit 55 via a sense buffer enable circuit 58. The signal ATD in this way controls the decoder 52 and the enable circuit 58. The column predecoder 52 and the sense buffer circuit 55 are enabled only while the address change detection signal ATD is output.

FIG. 3 shows a circuit diagram of the address change detector 57. The address change detector 57 comprises detector sections $AD_1$ to $AD_n$, associated column address signals $CA_1$ to $CA_n$ and an output circuit section DO. The detector section $AD_1$ includes a resistor R1 having one end connected to a high-potential power supply $V_{cc}$ and the other end (i.e., output terminal P) connected to a low-potential power supply $V_{ss}$ (i.e., ground level) via two series connected enhancement type N channel MOS transistors (NMOS transistors) T1 and T2. This series circuit of the NMOS transistors T1 and T2 forms a first detector section. Further, the output terminal P of the resistor R1 is connected to the low-potential power supply $V_{ss}$ via two enhancement type NMOS transistors T3 and T4 connected in series. This series circuit of the NMOS transistors T3 and T4 forms a second detector section. The first and second detector sections as shown in FIG. 3 are connected in parallel.

The column address signal CA1 is input, via four inverter circuits 61, 62, 63 and 64, to the gate of the first NMOS transistor T1 of the first detector section. The column address signal CA1 is input, via one inverter circuit 61, to the gate of the second NMOS transistor T2. The column address signal CA1 is input, via five inverter circuits 61, 65, 66, 67 and 68, to the gate of the third NMOS transistor T3 of the second detector section. The column address signal CA1 is input, via two inverter circuits 61 and 65, to the gate of the fourth NMOS transistor T4.

When the column address signal CA1 is kept low, the first and fourth NMOS transistors T1 and T4 are off, so that the output at terminal P is high. When the column address signal CA1 is kept high, the second and third NMOS transistors T2 and T3 are off, so that the output at terminal P is high. When the column address signal CA1 changes from low to high, for example, the second transistor T2 turns off first since it is gated to the least number of inverters. Following this, the fourth transistor T4 and then the first transistor T1 turns on. Finally, the third transistor T3 turns off. Accordingly, during the period of time, tb, from when the fourth transistor T4 turns on to when the third transistor T3 turns off, the second detector section becomes conductive and maintains the output terminal P at a low voltage level.

When the column address signal CA1 falls low, the second transistor T2 turns on first since it is gated to the least number of inverters. The fourth transistor T4 then turns off as does the first transistor T1. Finally, the third transistor T3 turns on. Accordingly, during the period of time, tb, from when the second transistor T2 turns on to when the first transistor T1 turns off, the first detector section becomes conductive so that the output terminal P is maintained low.

When the column address signal CA1 changes in this manner, the detection signal AT1, maintained low during the time period tb, is output to the output circuit section DO. Likewise, the other detector sections $AD_2$ to $AD_n$ detect the associated column address signals $CA_2$ to $CA_n$ and output detection signals AT2 to ATn to the output circuit section DO.

The output circuit section DO comprises a plurality of enhancement type P channel MOS transistors (hereinafter called PMOS transistors) $T_{A1}$ to $T_{An}$, a resistor R2 and two inverter circuits 69 and 70. Each of the PMOS transistors $T_{A1}$ to $T_{An}$ has a source connected to the high-potential power supply $V_{cc}$, and a drain connected via the resistor R2 to the low-potential power supply $V_{ss}$. The gates of the individual PMOS transistors $T_{A1}$ to $T_{A1}$ are supplied with respective detection signals AT1 to ATn from the associated detector sections $AD_1$ to $AD_n$. The inverters 69 and 70 are connected to the drains of the PMOS transistors $T_{A1}$ to $T_{An}$, and the address change detection signal ATD is output from the inverter 70.

When a level change occurs in any one of the column address signals $CA_1$ to $CA_n$, a low level detection signal is output from the detector section associated with the changed column address signal to the associated PMOS transistor during the period tb. With a low level detection signal supplied to the PMOS transistor, the transistor turns on during period tb, and its drain goes high. As a result, the address change detection signal ATD is output high from the inverter circuit 70.

When an address change occurs in the external address input signal $A_{IN}$, at least one of the column address signals $CA_1$ to $CA_n$ changes as shown in FIG. 4 (the signal that changes is expressed by CA1 in the diagram). In response to that signal change, the address change detection signal ATD is maintained high for the period of time tb. In accordance with the address change detection signal ATD, the column predecoder 52 is enabled to decode the column address signals $CA_1$ to $CA_n$ and to generate a column predecode signal (expressed by "CPAb" in the diagram for the sake of convenience). "CPAa" in the diagram illustrates the output waveform of the column predecode signal with the column predecoder 52 enabled without being affected by the address change detection signal ATD. In response to the column predecode signal CPAb, the column decoder 53 outputs the column select signal CSL to turn on the gate transistors Tg, thus reading data via the selected bit line pair BL and/BL. Then, the read data is output on the bus pair IO and/IO.

The address change detection signal ATD is supplied to the sense buffer enable circuit 58, which produces a sense buffer enable signal SBE based on the address change detection signal ATD and outputs it to the sense buffer circuit 55. In response to the signal from the enable circuit 58, the sense buffer circuit 55 outputs the data on the input/output bus pair IO and/IO, as read data RD. The output buffer circuit 56 then outputs the read data RD as the data output $D_{OUT}$. Absent any address change detection signal ATD and the column predecode signal CPAb, when the gate transistors Tg turns off and read data disappears. Accordingly, the sense buffer enable signal SBE also disappears and the sense buffer circuit 55 terminates the read operation.

Occasionally, there may be insufficient impedance matching between a DRAM and an external device which outputs the external address input signal $A_{IN}$. This state often occurs when a DRAM and an external device are interconnected on a Print Circuit Board (PCB). Should insufficient impedance matching exist between the external device and the DRAM, the external address input signal $A_{IN}$, output from the external device to the DRAM, produces an echo. This echo is superimposed on the external address input signal $A_{IN}$. Consequently, the noise is supplied to the DRAM as noise. Such noise often suppresses the complete voltage rise of signal $A_{IN}$ to that of an intermediate level as shown in FIG. 5 for a given time period. Only after that given period of time will signal $A_{IN}$ fully rise high. The same is true with respect to the column address signal CA.

At times the potential at which column decoder 52 responds to the column address signal CA (i.e., at V2) differs from the potential at which the address change detector 57 responds to the column address signal CA (i.e., at V1). When the potential V1 of address change detector 57 is less than the potential V2 of column predecoder 52, then the address change detector 57 output address change detection signal ATD first. When the column address signal CA is at a level less than potential V2, the predecoder 52, even if enabled, cannot decode the column address signal CA and maintains the output of the previous column predecode signal CA. This causes previous rather than current data to be output to the sense buffer circuit 55. All to often, the previous data is read from the sense buffer circuit 55 in response to the sense buffer enable signal SBE based on the address change detection signal ATD.

When the column address signal CA eventually reaches the threshold operating potential of the column predecoder 52, the predecoder 52 decodes the column address signal CA and target data is output to the sense buffer circuit 55. Unfortunately, the sense buffer signal SBE does not have enough time to disable the sense buffer circuit 55. Rather than allowing for correct data to be read, the noise read causes previous or erroneous data to be output as the read data RD.

Further, a column address signal CA may exhibit resonance near the intermediate level due to the superimposed noise. In this case, the address change detector 57 will output the address change detection signal ATD in accordance with the resonating waveform of the column address signal CA. If so, operations of the column predecoder 52 and the sense buffer circuit 55 will occur at an unexpected times, causing the reading of erroneous data.

Similar problems occur in voltage level detectors, other than the address change detectors, respecting the detected voltage level of input signals.

SUMMARY OF THE INVENTION

Accordingly, it is a primary object of the present invention to provide a voltage level detector which has decreased noise susceptibility.

It is further object of the present invention to provide a semiconductor memory device having an address change detector that is not affected by noise and that eliminates the reading of erroneous data.

To achieve the foregoing and other objects and in accordance with the purpose of the present invention, an improved voltage level detector is provided.

FIG. 6 is a block diagram explaining the general construction of a voltage level detector according to the present invention. The voltage level detector includes a detector section 100, an output circuit section 101 and a delay circuit section 102. In response to a target level detection signal s, the detector section 100 detects the potential level of the target signal S and determines if the voltage level of the target signal S lies within a predetermined voltage zone. When the target signal S is found to be within that zone, the output circuit section 101 outputs a detection signal AT. The delay circuit section 102 is provided between the detector section 100 and the output circuit section 101. When the detector section 100 detects a deviation in the voltage level of the target signal S from that of the predetermined voltage zone, the delay circuit section 102 delays the vanishing of the detection signal AT as output from the output circuit section 101 by a given period of time. In other words, the delay circuit section 102 effectively maintains the detection signal AT for a given period of time.

FIG. 7 is a specific circuit diagram of a voltage level detector according to the present invention. The voltage level detector includes a resistor R having one end connected to a power supply $V_{cc}$ and the other end connected to a first and second parallel detector sections LD1 and LD2. The first detector section LD1 is formed by first and second series connected transistors T11 and T12. The second detector section LD2 is formed by third and fourth series connected transistors T13 and T14.

The control terminal of the second transistor T12 is directly supplied with a target level detection signal S. The control terminal of the first transistor T11 is coupled to a first delay circuit 1. The first delay circuit 1 inverts the signal level of the target signal S, and allows the inverted target signal S to be input to the first transistor T11 at a time later than the input of the target signal S to the second transistor T12. A second delay circuit 2 is coupled to the control terminal of the third transistor T13. The second delay circuit 2 allows the target signal S to be input to the third transistor T13 following the input of the inverted target signal S to the first transistor T11 via the first delay circuit 1. A third delay circuit 3 is coupled to the control terminal of the fourth transistor T14. The third delay circuit 3 inverts the signal level of the target signal S, and allows the inverted target signal S to be input to the fourth transistor T14 that is not only earlier than the input of the inverted target signal S to the first transistor T11 via the first delay circuit 1, but that is later than input of the target signal S to the second transistor T12.

The input stage of the second delay circuit 2 is formed by an inverter circuit 2a having a threshold operating potential higher than the threshold operating potential of the second transistor T12. The input stages of the first and third delay circuits 1 and 3 are formed by inverter circuits 1a and 3a. The inverter circuits 1a and 3a have threshold operating potentials higher than the threshold operating potential of the inverter circuit 2a.

According to the voltage level detector as shown in FIG. 7, when the target signal S is set low, the first and fourth transistors T11 and T14 are turned ON, and the second and third transistors T12 and T13 are turned OFF. Thereafter, when the target signal S goes high, the second transistor T12 turns on first. Just after the change of the target signal level, the first transistor T11 is still set ON due to the function of the first delay circuit 1. Therefore, the first detector section LD1 is conductive. Subsequently, the fourth transistor T14 turns off by the action of the third delay circuit 12. Next, the first transistor T11 turns off by the action of the first delay circuit 11. Finally the third transistor T13 turns on due to the operation of the second delay circuit 2.

The threshold operating potential of the inverter circuit 1a is higher than the threshold operating potential of the inverter circuit 2a, which in turn is higher than the threshold operating potential of the second transistor T12. Consequently, the first detector section LD1 is maintained conductive until the input voltage of the inverter circuit 1a reaches its threshold operating potential, and is thereby able to produce a detection signal AT.

When the target signal S falls low on the other hand, the fourth transistor T14 is turned on first. At this point of time, the third transistor T13 is still maintained ON by the second delay circuit 2. Therefore, the second detector section LD2 becomes conductive. The threshold operating potential of the inverter circuit 2a is lower than the threshold operating potential of the inverter circuit 3a. Consequently the second detector section LD2 is maintained conductive until the input voltage of the inverter circuit 2a reaches its threshold operating potential, and is thereby able to produce a detection signal AT.

BRIEF DESCRIPTION OF THE DRAWINGS

The features of the present invention that are believed to be novel are set forth with particularity in the appended claims. The invention, together objects and advantages thereof, may best be understood by reference to the following description of the presently preferred embodiments together with the accompanying drawings in which:

DETAILED DESCRIPTION OF THE PREFERRED EMBODIMENTS

Figure 1:
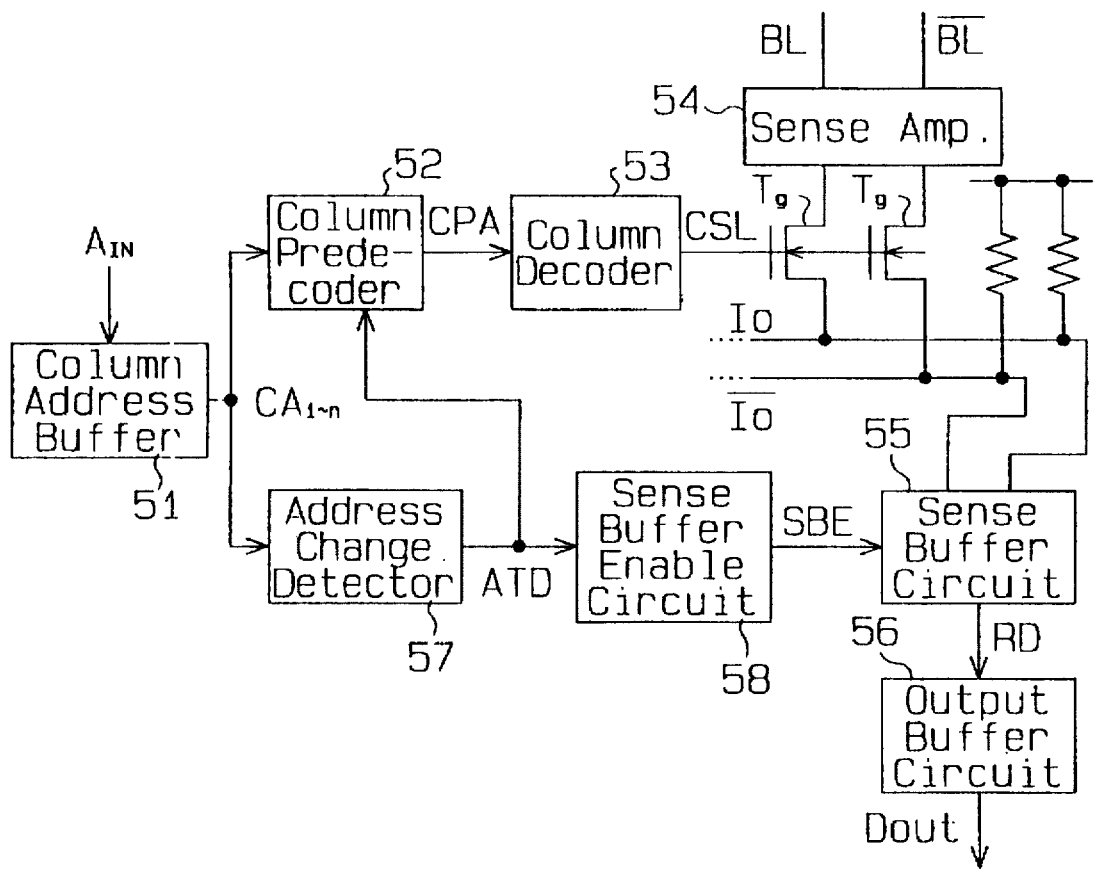
FIG. 1 is a schematic block diagram of the address access system of a DRAM.
Figure 2:
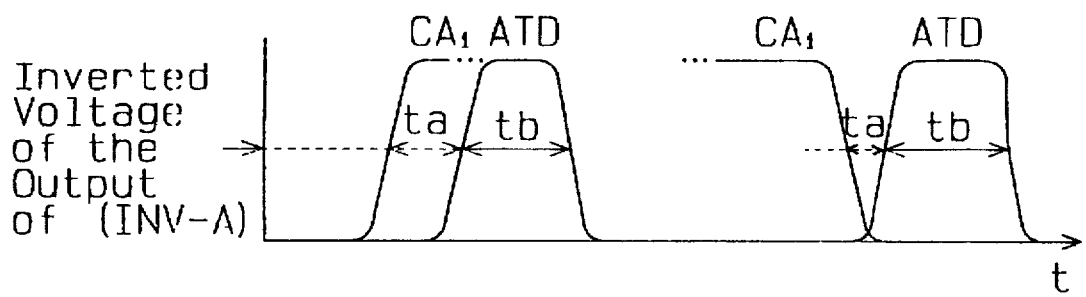
FIG. 2 is a graph illustrating the waveforms of a column address signal and an address change detection signal.
Figure 3:
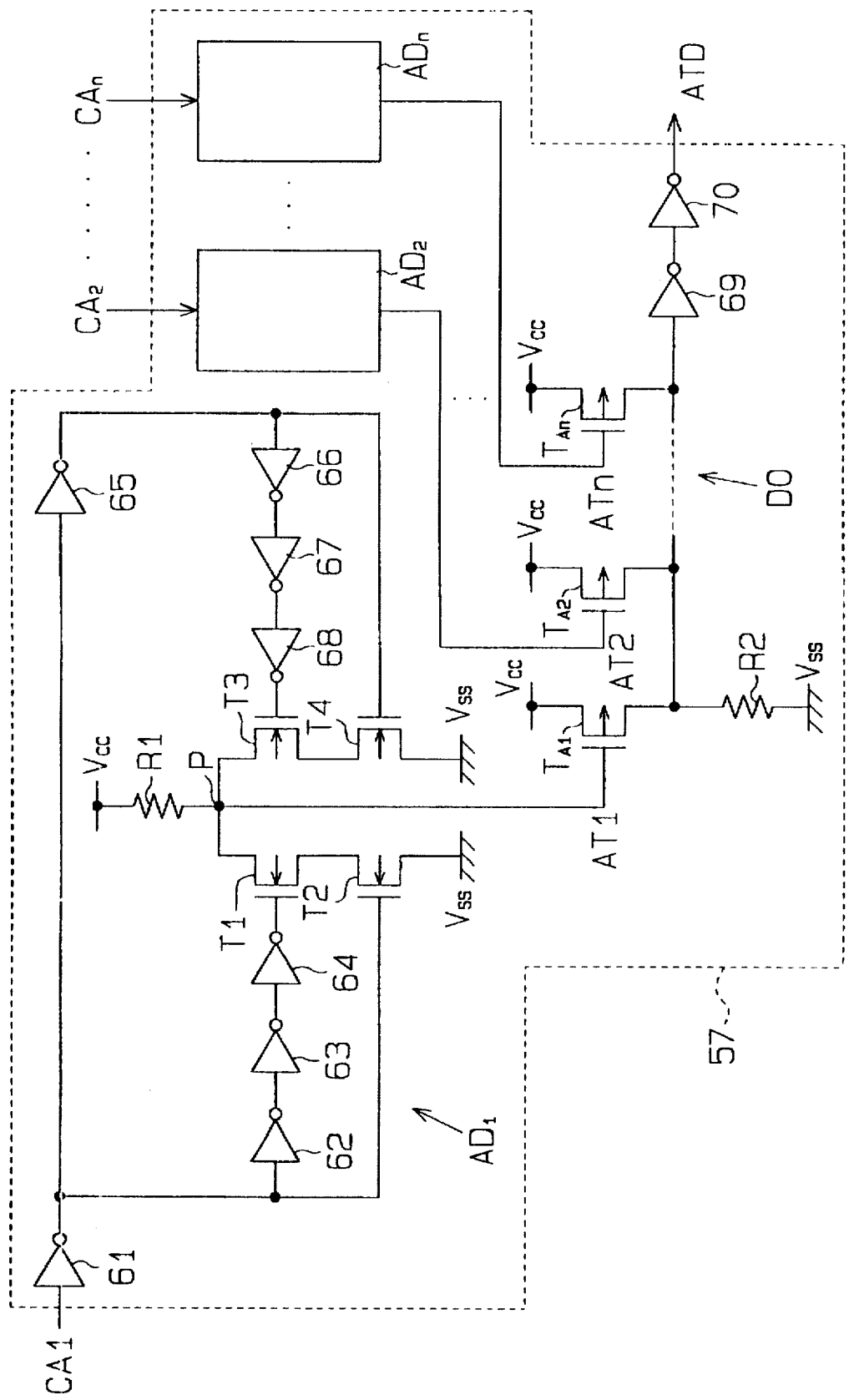
FIG. 3 is a circuit diagram of a conventional address change detector.
Figure 4:
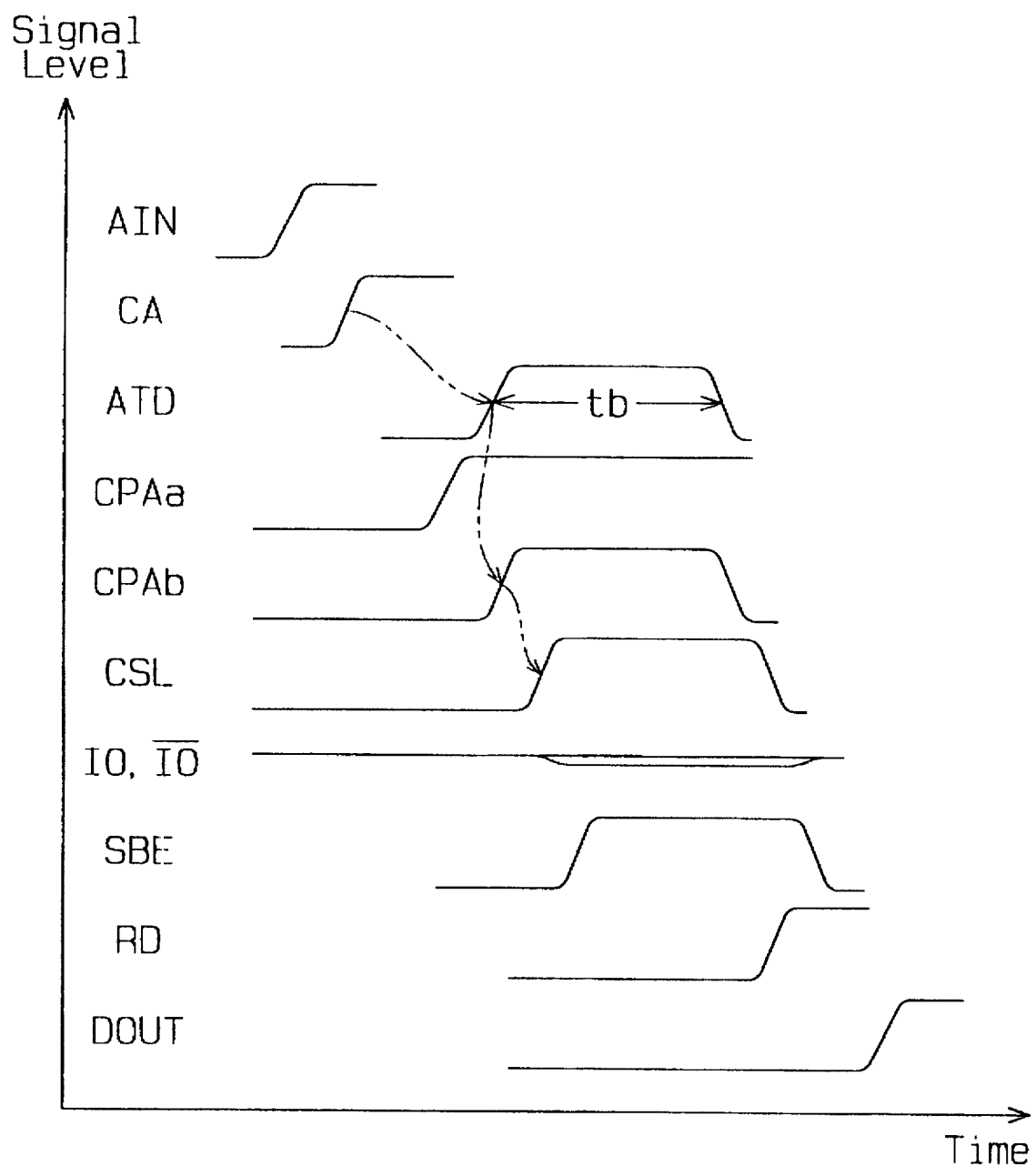
FIG. 4 is a graph illustrating various waveforms explaining the operation of a DRAM using the conventional address change detector.
Figure 5:
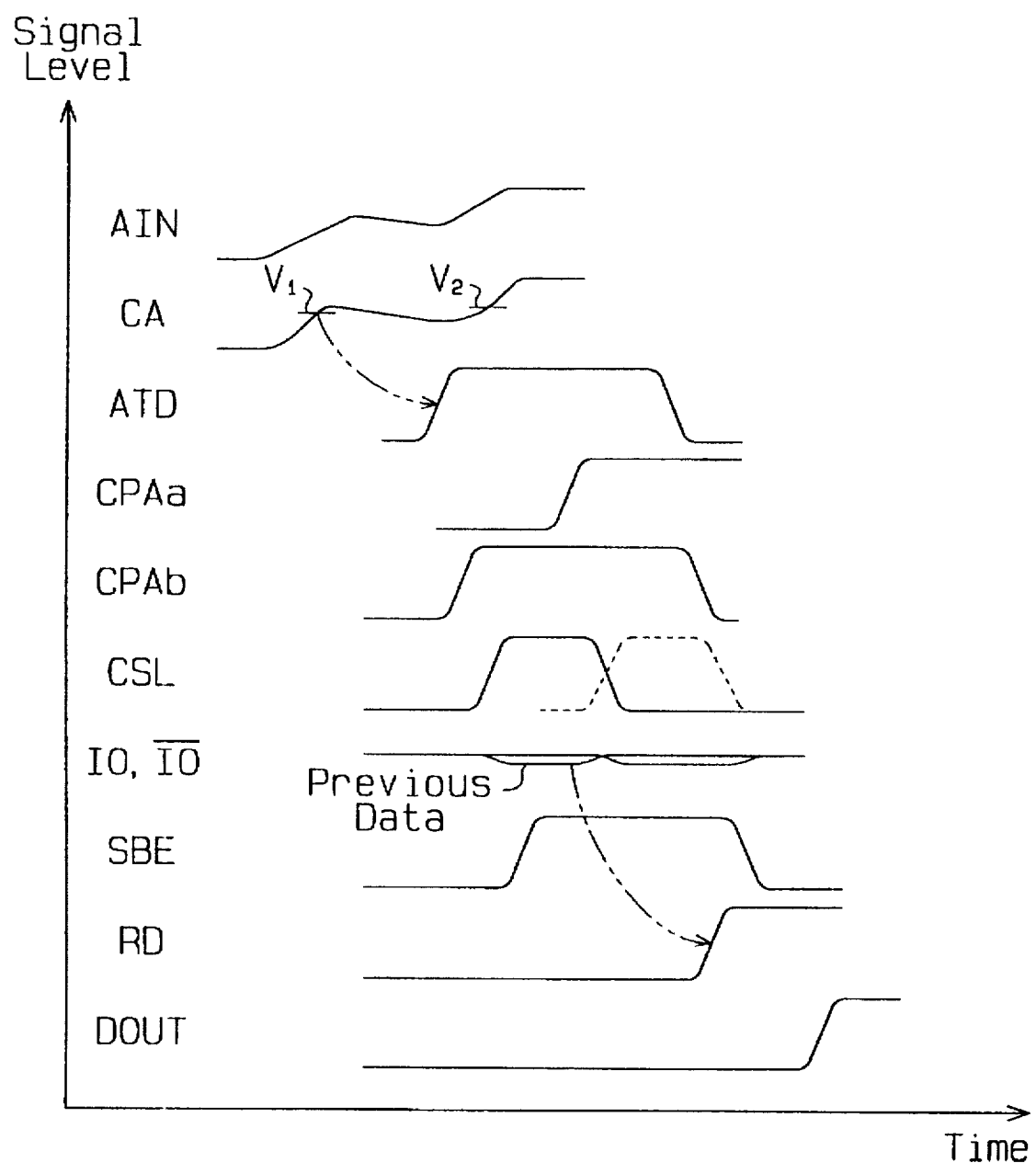
FIG. 5 is a graph illustrating various waveforms explaining the operation of the DRAM when a noise-superimposed column address signal appears.
Figure 6:
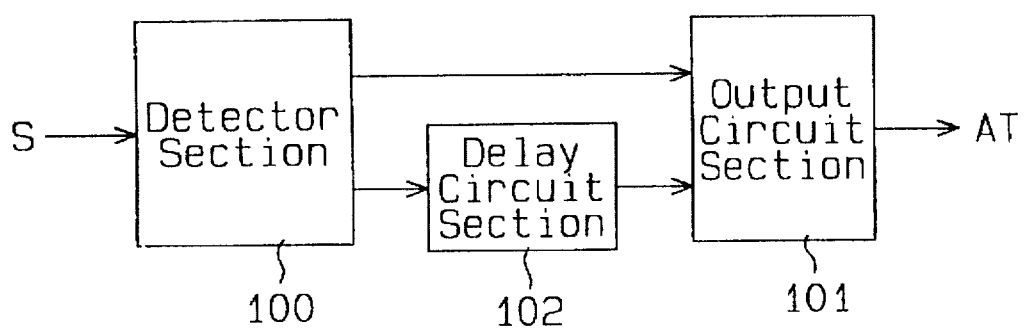
FIG. 6 is a block diagram illustrating one aspect of the present invention.
Figure 7:
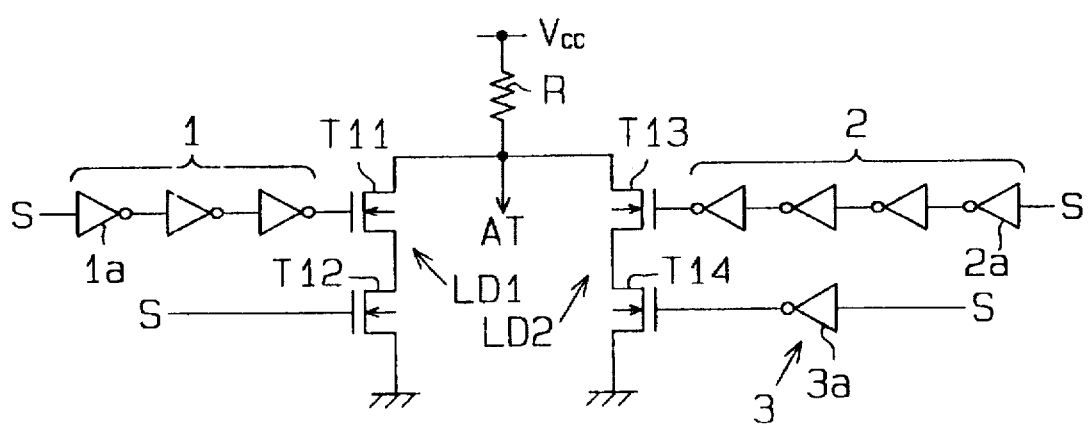
FIG. 7 is a specific circuit diagram illustrating a second aspect of the present invention.

An embodiment of the present invention will be described with reference to FIGS. 8 through 11. This embodiment relates to an address change detector for use in a DRAM as shown in FIG. 1. Other elements than the address change detector have substantially the same as those in the DRAM shown in FIG. 1. Therefore, a description will be given only of the address change detector, and the explanation of the other elements will be omitted.

Figure 8:
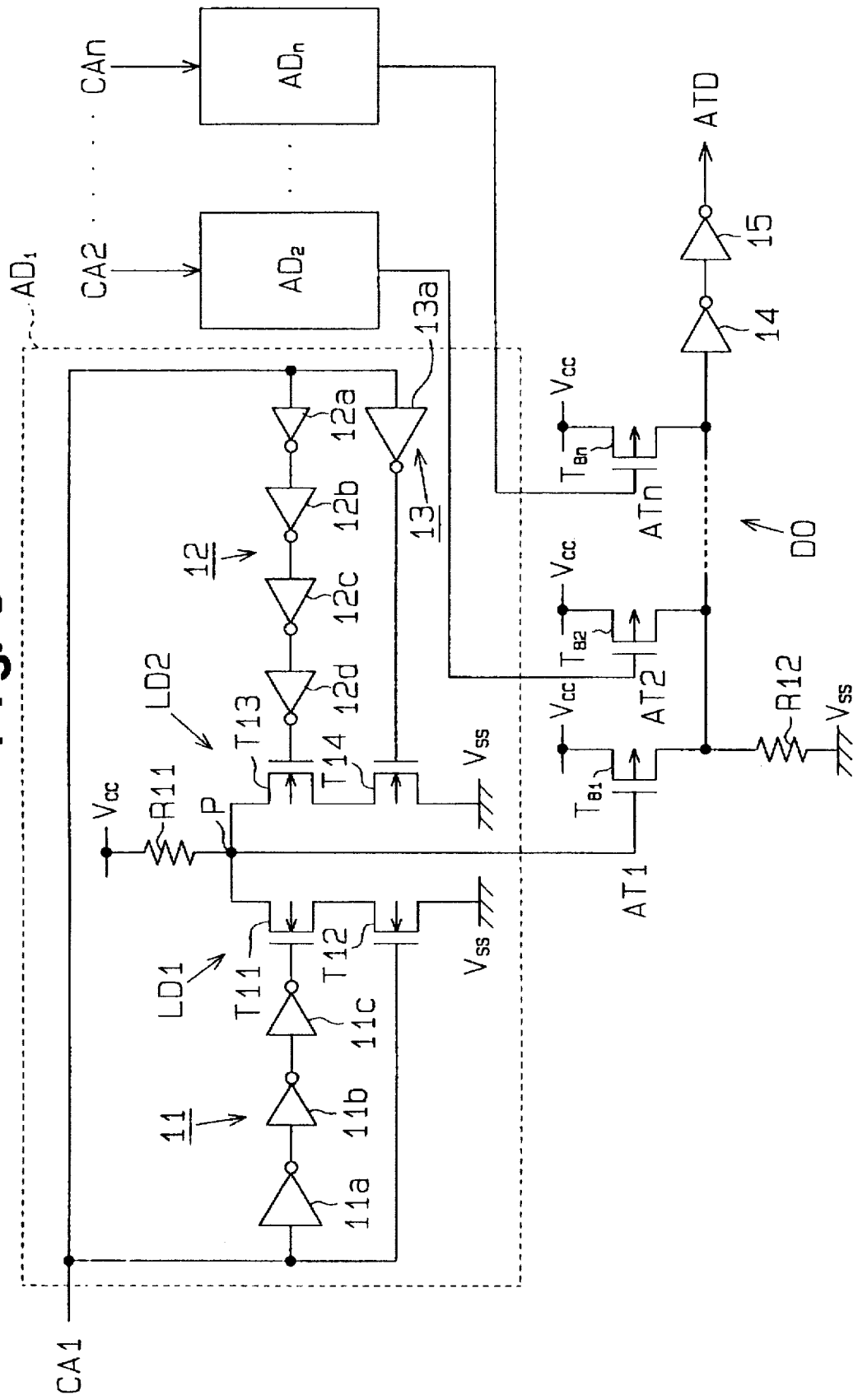
FIG. 8 is a circuit diagram of an address change detector according to an embodiment of the present invention.

FIG. 8 shows an address change detector according to this invention. The address change detector includes a plurality of detecting circuit sections $AD_1$ and $AD_2$ to $AD_n$. The detecting circuit sections $AD_1$ to $AD_n$ receive different column address signals CA1 and CA2 to CAn, respectively, but have a common circuit structure. Therefore, the first detecting circuit section $AD_1$ only will be described for the convenience of explanation.

The detecting circuit section $AD_1$ includes a resistor R11 having one end connected to a high-potential power supply $V_{cc}$ and the other end as an output terminal P connected to a low-potential power supply $V_{ss}$ (i.e., ground level) via a first and second detector sections LD1 and LD2. The two detector sections LD1 and LD2 are provided in parallel. The first detector section LD1 is composed of a first and second N channel MOS transistors T11 and T12. The second detector section LD2 is composed of a third and fourth N channel MOS transistors T13 and T14.

A column address signal CA1 is input to the gate of the first NMOS transistor T11 via a first delay circuit 11. The column address signal CA is directly input to the gate of the second NMOS transistor T12. The column address signal CA1 is input to the gate of the third NMOS transistor T13 via a second delay circuit 12. The column address signal CA1 is input to the gate of the fourth NMOS transistor T14 via a third delay circuit 13.

The first delay circuit 11 comprises three inverter circuits 11a, 11b and 11c, each of which is formed by a pair of CMOS transistors (not shown). The inverter circuit 11a at the first stage has the threshold voltage $V_H$ for signal level inversion higher than the threshold voltage $V_{thn}$ of the second MOS transistor T12. In this embodiment, the threshold operating voltages $V_{thn}$ of the first to fourth NMOS transistors T11 to T14 are the same.

Figure 9:
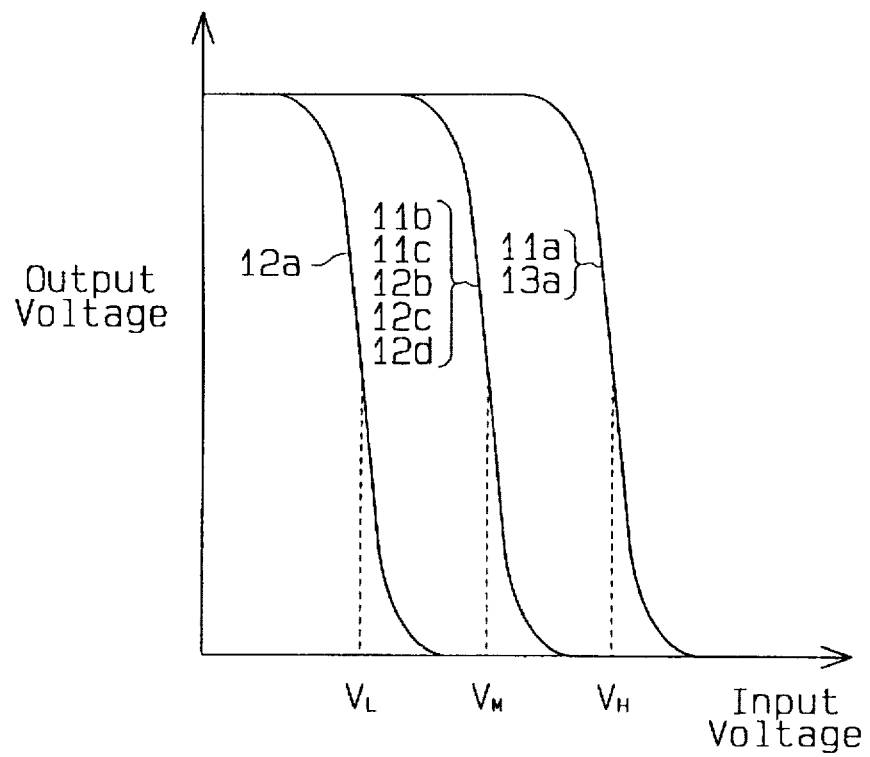
FIG. 9 is a graph illustrating threshold voltages of inverter circuits.

The second delay circuit 12 comprises four inverter circuits 12a, 12b, 12c and 12d, each of which is formed by a pair of CMOS transistors (not shown). The inverter circuit 12a at the first stage has the threshold voltage $V_L$ for signal level inversion that is lower than the threshold voltage $V_H$ and higher than the threshold voltage $V_{thn}$. The third delay circuit 13 comprises a single inverter circuit 13a formed by a pair of CMOS transistors (not shown). The inverter circuit 13a has the threshold voltage $V_H$ for signal level inversion that is the same as the threshold voltage $V_H$ of the inverter circuit 11a. In this embodiment, the inverter circuits 11b, 11c, 12b, 12c and 12d have the same threshold voltages $V_M$ for signal level inversion. The threshold voltage $V_M$ is higher than the threshold voltage $V_L$ and lower than the threshold value $V_H$, as shown in FIG. 9. Those threshold voltages $V_L$, $V_M$ and $V_H$ can be adjusted by altering the ratio of channel widths of NMOS and PMOS transistors forming each inverter circuit or the ratio of channel lengths of the NMOS and PMOS transistors.

The greater the number of inverter circuits is, the longer the delay time is, so that the delay times become longer in the order of the third delay circuit 13, the first delay circuit 11 and the second delay circuit 12. Further, the higher the threshold voltage of the first-stage inverter circuit is, the slower the signal level inversion the rising of the column address signal CA1 is and the quicker the signal level inversion to the falling of the column address signal CA1 is.

If the column address signal CA1 is kept low, the second and third transistors T12 and T13 are turned OFF so that the output terminal P is set high. If the column address signal CA1 is kept high, the first and fourth transistors T11 and T14 are turned OFF so that the output terminal P is set high. When the column address signal CA1 changes from low to high, for example, the second transistor T12 having no delay circuit is turned on first, as soon as the potential level of the column address signal CA1 reaches the threshold voltage $V_{thn}$ of the transistor T12 ($V_{thn}<V_L$). Then, the fourth transistor T14 is turned off in response to the inverted signal output from the inverter circuit 13a when the potential level of the column address signal CA1 reaches the threshold voltage $V_H$ ($V_H>V_M$). Next, the first transistor T11 is turned off. At this time, the signal level inversion at the first-stage inverter circuit 11a occurs when the voltage level of the column address signal CA reaches the threshold voltage $V_H$ ($V_H>V_M$). Finally, the third transistor T13 is turned on. At this time, the signal level inversion at the first-stage inverter circuit 12a occurs when the voltage level of the column address signal CA1 reaches the threshold voltage $V_L$ ($V_L<V_M$).

Therefore, the first detector section LD1 becomes conductive only for the duration from when the second transistor T12 is turned on to when the first transistor T11 is turned off. The conductive state of the section LD1 continues while the column address signal CA1 lies between the threshold voltage $V_{thn}$ and the threshold voltage $V_H$. Meanwhile, the second detector section LD2 is kept non-conductive. As a result, the output terminal P becomes an L level.

When the column address signal CA1 goes low, the second transistor T12 is turned off first due to the absence of inverter circuit. The turning off of the transistor T12 occurs when the voltage level of the column address signal CA1 reaches the threshold voltage $V_{thn}$ ($V_{thn}<V_L$). Then, the fourth transistor T14 is turned on. At this time, the signal level inversion at the inverter circuit 13a occurs when the voltage level of the column address signal CA1 reaches the threshold voltage $V_H$ ($V_H>V_M$). Next, the first transistor T11 is turned on. At this time, the signal level inversion at the inverter circuit 11a occurs when the column address signal CA1 reaches the threshold voltage $V_H$ ($V_H>V_M$). Finally, the third transistor T13 is turned on. The signal level inversion at the inverter circuit 12a occurs when the voltage level of the column address signal CA1 reaches the threshold voltage $V_L$ ($V_L<V_M$).

Therefore, the second detector section LD2 becomes conductive only for the duration from when the fourth transistor T14 is turned on to when the third transistor T13 is turned off. The conductive state of the detector section LD2 continues while the column address signal CA1 lies between the threshold voltage $V_H$ and the threshold voltage $V_L$. Meanwhile, the first detector section LD1 is kept non-conductive. As a result, the output terminal P becomes the L level. The L-level signal is output as a detection signal AT1.

The address change detector according to this embodiment further includes an output circuit section DO. The output circuit section DO comprises a plurality of P channel MOS transistors $T_{B1}$ and $T_{B2}$ to $T_{Bn}$, a resistor R12 and two inverter circuits 14 and 15. Each of the inverters 14 and 15 is formed by a pair of CMOS transistors (not shown). Each of the PMOS transistors $T_{B1}$ to $T_{Bn}$ has a source connected to the high-potential power supply $V_{cc}$ and a drain connected via the resistor R12 to the low-potential power supply $V_{ss}$ (i.e., ground level). The gates of the individual PMOS transistors $T_{B1}$ to $T_{Bn}$ receive detection signals AT1 to ATn of the associated detector sections $AD_1$ to $AD_n$, respectively. The inverter circuits 14 and 15 are connected to the drains of the PMOS transistors $T_{B1}$ to $T_{Bn}$, and an address change detection signal ATD is output from the inverter circuit 15. The threshold voltage of the inverter circuit 14 is set to the same voltage as the threshold voltage $V_L$ of the inverter circuit 12a. The threshold voltage of the inverter circuit 15 is set to the same voltage as the threshold voltage $V_M$ of the inverter circuit 11b.

The function of the address change detector will now be described. When the column address signal CA1 changes to an H level from an L level, the potential level of the column address signal CA1 rises and reaches the voltage $V_{thn}$. Then, the second NMOS transistor T12 turns on. Just at this time, the inverter circuit 11a of the first delay circuit 11 does not still perform signal level inversion, so that the first NMOS transistor T11 is kept on. Consequently, the first detector section LD1 is conductive and the output terminal P is set low.

When the level of the column address signal CA1 further rises and reaches the voltage $V_L$ from the voltage $V_{thn}$, the inverter circuit 12a of the second delay circuit 12 performs signal level inversion. The second delay circuit 12 turns on the third NMOS transistor T13 after a delay time determined by the four inverter circuits 12a to 12d. Just when the level of the signal CA1 reaches the voltage $V_L$, therefore, the third NMOS transistor T13 is still turned off. The inverter circuits 11a and 13a of the first and third delay circuits 11 and 13 do not still perform signal level inversion.

When the level of the column address signal CA1 further rises and reaches the voltage $V_H$ from the voltage $V_L$, the inverter circuits 11a and 13a perform signal level inversion. The fourth NMOS transistor T14 is turned off after a delay time at which the inverter circuit 13a performs inversion.

Just at this time, the third NMOS transistor T13 is not still turned on due to the action of the second delay circuit 12 and the second detector section LD2 is in a non-conductive state. The first delay circuit 11 turns off the first NMOS transistor T11 after a delay time determined by the three inverter circuits 11a, 11b and 11c. In response to the turning off of the first transistor T11, the first detector section LD1 becomes non-conductive.

Figure 10:
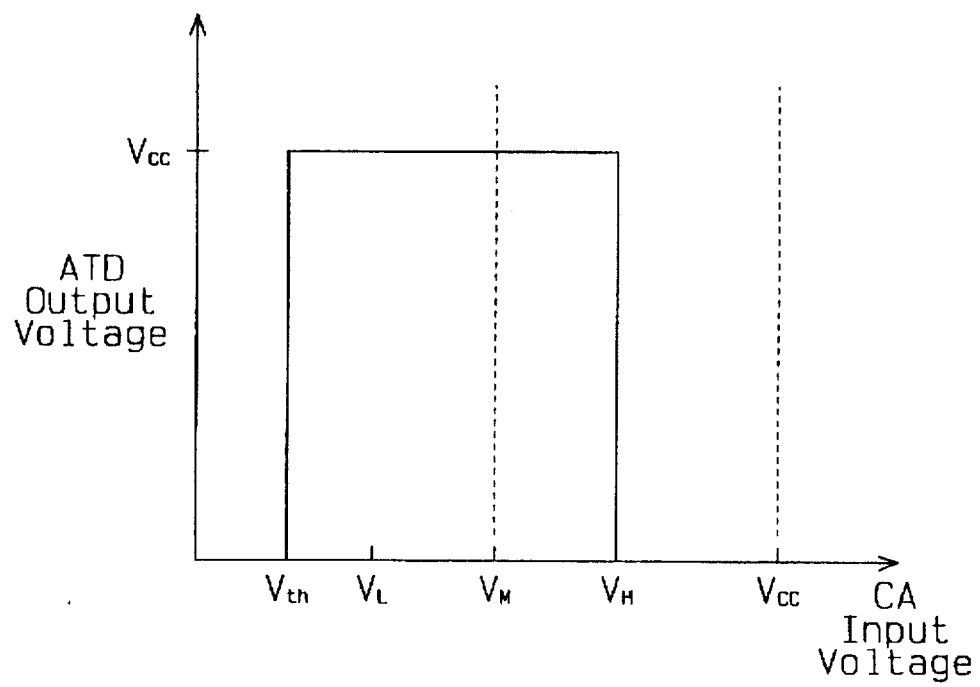
FIG. 10 is a graph showing the relationship between a column address signal and an address change detection signal.

The detecting circuit section $AD_1$ outputs a detection signal AT1 when the level of the column address signal CA1 rises and reaches the voltage $V_{thn}$, and stops outputting the detection signal AT1 when its signal level reaches the voltage $V_H$ and after the delay time determined by the first delay circuit 11 elapses. Consequently, the inverter circuit 15 of the address change detector outputs the address change detection signal ATD which is the detection signal AT1 inverted. That is, the address change detector outputs the high level address change detection signal ATD only while the level of the column address signal CA1 lies between the voltage $V_{thn}$ and the voltage $V_H$, as shown in FIG. 10.

When the level of the column address signal CA1 changes to an L level from an H level, the level of the signal CA1 reaches the voltage $V_H$. Then, the fourth NMOS transistor T14 is turned on and the second detector section LD2 becomes conductive, so that the address change detection signal ATD is output. When the level of the column address signal CA1 reaches the voltage $V_L$, the third NMOS transistor T13 is turned off and the second detector section LD2 becomes non-conductive, so that the address change detection signal ATD vanishes. Therefore, the address change detector outputs a high level address change detection signal ATD only while the level of the column address signal CA1 lies between the voltage $V_H$ and the voltage $V_L$.

Figure 11:
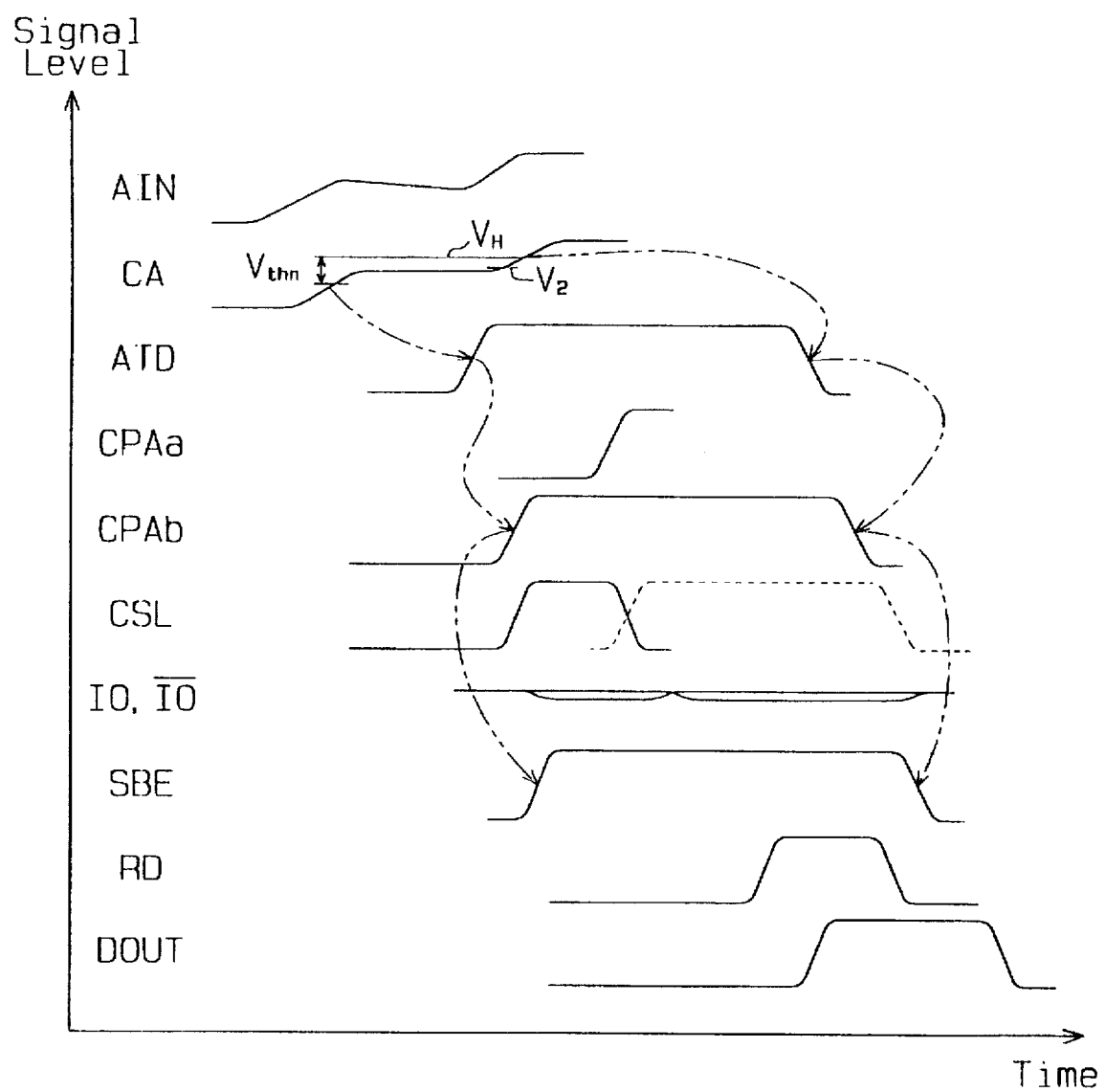
FIG. 11 is a graph illustrating various waveforms explaining the operation of a DRAM using the address change detector according to the embodiment.

According to the address change detector of this embodiment, the address change detection signal ATD does not vanish only while the level of the column address signal lies between the voltage $V_{thn}$ and the voltage $V_H$. The address change detection signal ATD is output to the column predecoder 52 and sense buffer enable circuit 58 shown in FIG. 1. As mentioned above, the address change detection signal ATD does not vanish while the level of the column address signal lies in a predetermined voltage zone. As shown in FIG. 11, an external address input signal AIN may have a voltage level waveform such that the voltage of the signal AIN reaches a high level after staying around the intermediate level between the high and low voltage levels for a certain period of time, due to the noise superimposing on the signal AIN at the time of address changing. In this case, the column address signal CA1 also appears as the same waveform as that of the signal AIN.

At this time, the threshold operating potential of the column predecoder 52 respecting the column address signal CA differs from that of the address change detector 57, and the threshold operating potential $V_2$ of the column predecoder 52 lies in the aforementioned responsive voltage zone of the address change detector. This responsive voltage zone can be changed by changing the threshold voltages of the inverter circuits 11a, 12a and 13a of the address change detector.

Even when the column address signal CA stays around the intermediate level due to the noise superimposing, as shown in FIG. 11, the address change detection signal ATD does not vanish until the delay time of the first delay circuit 11 elapses after the level of the column address signal CA reaches the threshold voltage $V_H$. While the address change detection signal ATD is output, therefore, the output of the sense buffer enable signal SBE from the sense buffer enable circuit 58 continues. As a result, correct data can be read as read data RD, unlike in the conventional art in which previous or erroneous data is read as read data RD.

Even if the noise-superimposed column address signal CA vibrates in the responsive voltage zone of the address change detector, the address change detector can keep outputting the address change detection signal ATD which has responded to the vibrating waveform. As a result, the column predecoder 52 and the sense buffer circuit 55 have no malfunction such as the unintended fluctuation between enabling and disabling.

Although only one embodiment of the present invention has been described herein, it should be apparent to those skilled in the art that the present invention may be embodied in many other specific forms without departing from the spirit or scope of the invention. Particularly, it should be understood that the present invention may be embodied in the following forms.

The present invention may be applied to address change detectors for semiconductor memory devices such as an SRAM, EPROM and ROM, besides DRAM.

While the present invention is embodied in an address change detector for a semiconductor memory device in the above-described embodiment, the present invention may be applied to a detecting apparatus for determining whether a voltage level is within a predetermined voltage level zone or range.

In the first to third delay circuits 11 to 13 in each detecting circuit section, the number of inverter circuits may be changed to alter the delay time of the delay circuit.

A delay circuit may be coupled to the gate of the second NMOS transistor T12. In this case, it is necessary to adjust the delay times of the first to third delay circuits 11 to 13.

The first to fourth NMOS transistors T11 to T14 in the above-described embodiment may be replaced with other types of transistors such as P channel MOS transistors.

Figure 12:
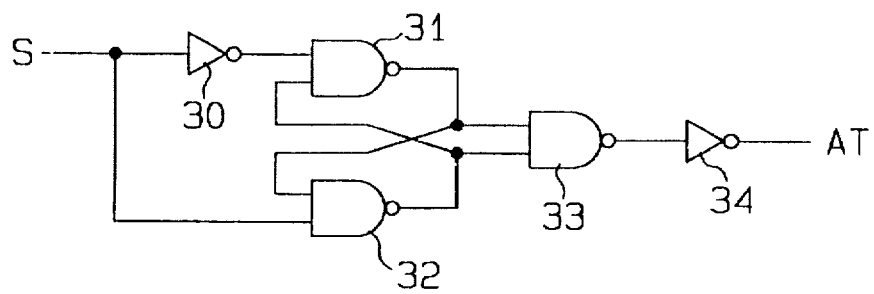
FIG. 12 is a circuit diagram of a voltage level detector according to another embodiment of the present invention.

FIG. 12 shows another example of a voltage level detector according to the present invention. The voltage level detector comprises two inverter circuits 30 and 34 and three NAND gates 31, 32 and 33, each of which is a two-input type NAND gate, as shown in FIG. 12. The first and second NAND circuits 31 and 32 form a flip-flop circuit. The first NAND gate 31 has a first input terminal receiving a target level detection signal S whose potential level is to be detected, via the first inverter circuit 30, and a second input terminal connected to the output terminal of the second NAND gate 32. The second NAND gate 32 has a first input terminal directly supplied with the target level detection signal S, and a second input terminal connected to the output terminal of the first NAND gate 31. The third NAND gate 33 is supplied with the outputs from the first and second NAND circuits 31 and 32. The output of the third NAND gate 33 is output to the second inverter circuit 34, which outputs a detection signal AT. The threshold voltage for signal level inversion of the first inverter 30 is set lower than the threshold voltages at which the NAND gates 31 and 32 perform signal level inversions. The threshold voltage for signal level inversion of the third NAND circuit 33 is set equal to the threshold voltage of the first inverter circuit 30.

When a target signal S is set low, the output of the first NAND gate 31 is set low and the output of the second NAND gate 32 is set high. Accordingly, the output of the third NAND gate 33 is set high so that the detection signal AT is set low.

As the voltage level of the target signal S rises, the first inverter circuit 30 having a relatively low threshold voltage outputs an inverted signal or a low level signal first, so that the output of the first NAND gate 31 goes high. If the level of the target signal S has not yet reached the threshold voltage of the second NAND gate 32 at that time, the output of the third NAND gate 33 becomes an L level and the detection signal AT goes high.

When the level of the target signal S reaches the threshold voltage of the second NAND gate 32, the second NAND gate 32 outputs a low level signal. The signal level inversion to the L level at the NAND gate 32 causes the output of the third NAND gate 33 to go high. This inversion is delayed due to the low threshold voltage of the second NAND gate 32. Therefore, the detection signal AT vanishes or becomes an L level with the delay time which is the sum of the operational delay of the third NAND gate 33 and the operational delay of the second NAND gate 32 after the level of the input signal S reaches the threshold voltage of the second NAND gate 32.

When the voltage level of the target signal S falls below the threshold voltage of the first inverter 30 but does not reach the threshold voltage of the second NAND gate 32, the first NAND gate 31 performs the signal level inversion to an L level from an H level and the detection signal AT vanishes with a delay of a given time.

When the target signal S is at a high level, the output of the first NAND gate 31 is set high and the output of the second NAND gate 32 is set low. Thus, the output of the third NAND gate 33 goes high and the detection signal AT goes low.

As the target signal S changes from high to low, the second NAND circuit 32 having a relatively high threshold voltage outputs a high level output signal first, so that the output of the second NAND gate 32 goes high. At this time, the level of the target signal S has not yet reached the threshold voltage of the first inverter 30, so that the first inverter circuit 30 does not perform signal level inversion. Therefore, the output of the third NAND gate 33 goes low and the detection signal AT goes high.

When the voltage level of the target signal S further falls and reaches the threshold voltage of the first inverter 30, the first inverter 30 outputs a high level signal. The level inversion of the inverter 30 to the H level causes the output of the first NAND gate 31 to become an L level. This level inversion is delayed due to the high threshold voltage of the first NAND gate 31. Therefore, the detection signal AT vanishes with the delay time which is the sum of the operational delay of first NAND gate 31 and the operational delay of the third NAND gate 33.

When the level of the target signal S exceeds the threshold voltage of the second NAND gate 32 but does not reach the threshold voltage of the first inverter 30, the detection signal AT vanishes in such the same manner.

Accordingly, the voltage level detector shown in FIG. 12 can determines whether the voltage level of a target signal is within a predetermined voltage zone or range. The voltage level detector can be used as an address change detector for a semiconductor memory device as above-described, and same function and advantages can be obtained by the voltage level detector.

Therefore, the present examples and embodiments are to be considered as illustrative and not restrictive and the invention is not to be limited to the details given herein, but may be modified within the scope of the appended claims.

What is claimed is:

1. A voltage level detector including a first detector section having first and second transistors connected in series, a second detector section having third and fourth transistors connected in series, the first and second detector sections being arranged in parallel and connected to a power supply via a resistor, said voltage level detector comprising:

a control terminal of said second transistor being supplied with a target signal whose voltage level is to be detected;

a first delay circuit, connected to a control terminal of said first transistor, for inverting the level of said target signal and for allowing the inverted target signal to be supplied to said first transistor at a time later than the input of said target signal to said second transistor;

a second delay circuit, connected to a control terminal of said third transistor, for allowing said target signal to be supplied to said third transistor at a time later than the input of the inverted target signal to said first transistor via said first delay circuit; and a third delay circuit, connected to a control terminal of said fourth transistor, for inverting the level of said target signal and for allowing the inverted target signal to be supplied to said fourth transistor at a time later than the input of the target signal to said second transistor and earlier than the input of the inverted target signal to said first transistor via said first delay circuit.

2. The voltage level detector according to claim 1, wherein said second delay circuit is provided with an input stage formed by an inverter whose threshold operating potential respecting said target signal is higher than a threshold operating potential of said second transistor; and wherein each of said first and third delay circuits is provided with an input stage formed by an inverter whose threshold operating potential respecting said target signal is higher than the threshold operating potential of the inverter of said second delay circuit.

3. The voltage level detector according to claim 1, wherein said first delay circuit is composed of the odd number of inverters; wherein said second delay circuit is composed of the even number of inverters; and wherein said third delay circuit is composed of the odd number of inverters.

4. The voltage level detector according to claim 1, wherein each of said first, second and third delay circuits is formed by at least one inverter.

5. The voltage level detector according to claim 2, wherein each of the inverters forming said input stages of said first, second and third delay circuits is formed by a pair of enhancement type P channel and N channel MOS transistors; and wherein the threshold operating potential of each of said inverters is adjusted by changing a ratio of the channel width of the enhancement type P channel MOS transistor to the channel width of the enhancement type N channel MOS transistor, or a ratio of the channel length of the enhancement type P channel MOS transistor to the channel length of the enhancement type N channel MOS transistor.

6. The voltage level detector according to claim 1, wherein each of said first to fourth transistors of said first and second detector sections is formed by an enhancement type N channel MOS transistor.

7. A semiconductor memory device including an address buffer for receiving an external address signal; an address change detector for detecting changes of the voltage level of the external address signal from the address buffer; and an address decoding circuit coupled to the address buffer and the address change detector for decoding the external address signal in response to an output from the address change detector, wherein said address change detector is formed by said voltage level detector according to claim 1.

8. A dynamic random access memory including an address buffer for receiving an external address signal; an address change detector for detecting changes of the voltage level of the external address signal from the address buffer; and an address decoding circuit coupled to the address buffer and the address change detector for decoding the external address signal in response to an output from the address change detector, wherein said address change detector is formed by said voltage level detector according to claim 1.

9. A voltage level detector comprising:

a flip-flop circuit including a first and second NAND gates and having a first and second input terminals, said first input terminal being supplied with a target signal whose voltage level is to be detected;

a first inverter receiving said target signal and coupled to the second input terminal of said flip-flop circuit, said first inverter having a threshold operating potential lower than those of said first and second NAND gates; and a third NAND gate for receiving the outputs from said first and second NAND gates and for generating an output signal, said third NAND gate having a threshold operating potential lower than those of said first and second NAND gates.

10. The voltage level detector according to claim 9 further comprising a second inverter connected to an output terminal of said third NAND gate.

11. A semiconductor memory device including an address buffer for receiving an external address signal; an address change detector for detecting changes of the voltage level of the external address signal from the address buffer; and an address decoding circuit coupled to the address buffer and the address change detector for decoding the external address signal in response to an output from the address change detector, wherein said address change detector is formed by said voltage level detector according to claim 9.

12. A dynamic random access memory including an address buffer for receiving an external address signal; an address change detector for detecting changes of the voltage level of the external address signal from the address buffer; and an address decoding circuit coupled to the address buffer and the address change detector for decoding the external address signal in response to an output from the address change detector, wherein said address change detector is formed by said voltage level detector according to claim 9.

* * * * *